(12) United States Patent
Lin et al.

(10) Patent No.: US 6,774,648 B1
(45) Date of Patent: Aug. 10, 2004

(54) APPARATUS AND METHODS FOR OPTICALLY DETECTING DEFECTS IN VOLTAGE CONTRAST TEST STRUCTURES

(75) Inventors: Jason C. H. Lin, Richardson, TX (US); Steven G. Oestreich, Mesa, AZ (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 58 days.

(21) Appl. No.: 10/215,244

(22) Filed: Aug. 6, 2002

Related U.S. Application Data

(60) Provisional application No. 60/383,301, filed on May 23, 2002.

(51) Int. Cl.$^7$ ............................................. G01R 31/302
(52) U.S. Cl. ...................................................... 324/752
(58) Field of Search ................................ 324/750–754, 324/765, 158.1; 250/307–311, 397, 492.2

(56) References Cited

U.S. PATENT DOCUMENTS

| | | | |
|---|---|---|---|
| 4,644,172 A | | 2/1987 | Sandland et al. ............ 250/548 |
| 4,902,967 A | | 2/1990 | Flesner .................... 324/158 R |
| 5,216,235 A | * | 6/1993 | Lin ........................... 250/201.6 |
| 5,412,330 A | * | 5/1995 | Ravel et al. ................. 324/753 |
| 5,489,852 A | | 2/1996 | Gomez ........................ 324/754 |
| 5,502,306 A | | 3/1996 | Meisburger et al. ......... 250/310 |
| 5,537,669 A | | 7/1996 | Evans et al. ................ 382/141 |
| 5,578,821 A | | 11/1996 | Meisburger et al. ......... 250/310 |
| 5,665,968 A | | 9/1997 | Meisburger et al. ......... 250/310 |
| 5,717,204 A | | 2/1998 | Meisburger et al. ......... 250/310 |
| 5,804,459 A | | 9/1998 | Bolam et al. .................. 438/12 |
| 5,959,459 A | | 9/1999 | Satya et al. .................. 324/751 |
| 6,021,214 A | | 2/2000 | Evans et al. ................. 382/141 |
| 6,052,355 A | * | 4/2000 | Saito et al. ............. 369/112.28 |
| 6,061,814 A | | 5/2000 | Sugasawara et al. ........ 714/724 |
| 6,084,716 A | * | 7/2000 | Sanada et al. ............... 359/629 |
| 6,091,249 A | | 7/2000 | Talbot et al. ................ 324/751 |
| 6,232,787 B1 | * | 5/2001 | Lo et al. ...................... 324/751 |
| 6,252,412 B1 | * | 6/2001 | Talbot et al. ................ 324/750 |
| 6,265,232 B1 | | 7/2001 | Simmons ...................... 438/14 |

(List continued on next page.)

FOREIGN PATENT DOCUMENTS

| | | | |
|---|---|---|---|
| EP | 853 243 A2 | 7/1998 | ......... G01R/31/307 |
| EP | 892 275 A2 | 1/1999 | ......... G01R/31/305 |
| WO | WO 99/22310 | 5/1999 | ........... G06F/17/00 |
| WO | WO 99/22311 | 5/1999 | ........... G06F/17/00 |

OTHER PUBLICATIONS

Tugbawa, et al, "Pattern And Process Dependencies In Copper Damascene Chemical Mechanical Polishing Processes," Jun. 1998, VLSI Multilevel Interconnect conference (VMIC).

Park et al, "Multi–Level Pattern Effects In Copper CMP," Oct. 1999, CMP Symposium Electrochemical Society Meeting.

Weiner, et al. "Apparatus and Methods for Monitoring Self–Aligned Contact Arrays", U.S. patent application No. 09/999,843, filed on Oct. 24, 2001.

(List continued on next page.)

*Primary Examiner*—Kamand Cuneo
*Assistant Examiner*—Jermele Hollington
(74) *Attorney, Agent, or Firm*—Beyer, Weaver & Thomas, LLP.

(57) ABSTRACT

Disclosed are apparatus and methods for optically inspecting a voltage contrast type test structure, product circuit pattern, or the like. An optical image of a voltage contrast type test structure is generated. When the optical image has a first type of intensity pattern, it is determined that there is a defect within the test structure. When the optical image has a second type of intensity pattern, it is determined that there is no defect. The intensity patterns correspond to different voltage potential patterns that are expected to be generated if the test structure were subject to a voltage contrast inspection.

38 Claims, 12 Drawing Sheets

U.S. PATENT DOCUMENTS

| | | | | |
|---|---|---|---|---|
| 6,292,582 B1 | | 9/2001 | Lin et al. | 382/149 |
| 6,321,601 B1 | * | 11/2001 | Maris | 73/657 |
| 6,324,298 B1 | | 11/2001 | O'Dell et al. | 382/149 |
| 6,344,750 B1 | | 2/2002 | Lo et al. | 324/751 |
| 6,504,393 B1 | * | 1/2003 | Lo et al. | 324/751 |
| 6,509,750 B1 | * | 1/2003 | Talbot et al. | 324/750 |
| 2002/0163348 A1 | * | 11/2002 | Harel et al. | 324/752 |

OTHER PUBLICATIONS

Weiner, et al. "Apparatus and Methods for Reliable and Efficient Detection of Voltage Contrast Defects", U.S. patent application No. 10/000,114, filed on Oct. 30, 2001.

Satya, et al., "Test Structures and Methods for Inspection of Semiconductor Integrated Circuits", U.S. Issued Patent No. 6,528,818, Issued on Mar. 4, 2003.

* cited by examiner

APPARATUS AND METHODS FOR OPTICALLY DETECTING DEFECTS IN VOLTAGE CONTRAST TEST STRUCTURES

CROSS-REFERENCE TO RELATED APPLICATION

This application takes priority under U.S.C. 119(e) of U.S. Provisional Application No.: 60/383,301 filed May 23, 2002 entitled, "APPARATUS AND METHODS FOR OPTICALLY DETECTING DEFECTS IN VOLTAGE CONTRAST TEST STRUCTURES" by Jason C. H. Lin and Steven G. Oestreich which is incorporated by reference in its entirety for all purposes.

BACKGROUND OF THE INVENTION

This invention relates to methods and apparatus for detecting electrical defects in a semiconductor device or test structure having a plurality of features that are specifically designed to produce varying voltage potentials during a voltage contrast inspection. More particularly, it relates to inspection techniques for detecting open and short type defects within the features of the circuit or test structure.

A voltage contrast inspection of a test structure is accomplished with a scanning electron microscope. The voltage contrast technique operates on the basis that potential differences in the various locations of a sample under examination cause differences in secondary electron emission intensities when the sample is the target of an electron beam. The potential state of the scanned area is acquired as a voltage contrast image such that a low potential portion of, for example, a wiring pattern might be displayed as bright (intensity of the secondary electron emission is high) and a high potential portion might be displayed as dark (lower intensity secondary electron emission). Alternatively, the system may be configured such that a low potential portion might be displayed as dark and a high potential portion might be displayed as bright.

A secondary electron detector is used to measure the intensity of the secondary electron emission that originates from the path swept by the scanning electron beam. Images may then be generated from these electron emissions. A defective portion can be identified from the potential state or appearance of the portion under inspection. The portion under inspection is typically designed to produce a particular potential and resulting brightness level in an image during the voltage contrast test. Hence, when the scanned portion's potential and resulting image appearance differs significantly from the expected result, the scanned portion is classified a defect.

Unfortunately, conventional voltage contrast inspection techniques have associated disadvantages. For example, conventional voltage contrast inspection uses a scanning electron microscope (SEM), which is a relatively expensive tool. Additionally, an SEM inspection has a relatively low throughput and, accordingly, represents a significant bottleneck in the semiconductor manufacturing process.

Accordingly, there is a need for improved apparatus and methods for efficiently detecting defects within a voltage contrast type test structure or circuit pattern.

SUMMARY

In general terms, the present invention provides apparatus and methods for optically inspecting a voltage contrast type test structure, product circuit pattern, or the like. An optical image of a voltage contrast type test structure is generated. When the optical image has a first type of intensity pattern, it is determined that there is a defect within the test structure. When the optical image has a second type of intensity pattern, it is determined that there is no defect. The intensity patterns correspond to different voltage potential patterns that are expected to be generated if the test structure were subject to a voltage contrast inspection. That is, the first intensity pattern corresponds to a first voltage potential pattern that would be generated during a voltage contrast inspection when there is a defect present, and the second intensity pattern, corresponds to a second voltage potential pattern that would be generated during a voltage contrast inspection when there is not defect present. For example, if the test structure was expected to have a same voltage potential during a voltage contrast inspection, the test structure may be expected have a corresponding uniform intensity value during an optical inspection. When this example test structure has an intensity pattern which includes different intensity values, it is determined that there is a defect within the test structure.

In one embodiment, a method of optically inspecting a semiconductor voltage contrast type structure that is designed to have an expected pattern of voltage potentials during a voltage contrast inspection is disclosed. An optical image of the structure is obtained. The optical image has a pattern of specific intensity values. When the pattern of intensity values of the optical image fail to substantially correspond to the expected pattern of voltage potentials of the structure, it is determined that the structure has a defect. When the pattern of bright and dark intensity values of the optical image substantially correspond to the expected pattern of voltage potentials of the structure, it is determined that the structure does not have a defect In a specific implementation, the expected pattern of voltage potentials correspond to a substantially same voltage potential on the test structure. In a further aspect, the pattern of intensity values correspond to the expected pattern of intensity values of the structure when the pattern of intensity values have a substantially same intensity value. In yet another aspect, the expected pattern of voltage potentials correspond to a portion of the structure that is coupled with a substrate. In another specific aspect, the pattern of intensity values correspond to the expected pattern of voltage potentials of the structure when the pattern of intensity values have a same relatively bright intensity value. In yet another implementation, the pattern of intensity values does not correspond to the expected pattern of intensity voltage potentials of the structure when the pattern of intensity values include a bright intensity value and a dark intensity value. In one aspect, the dark intensity value corresponds to the defect, and the defect is a complete or partial defect within the structure. In one implementation, the structure includes a plurality of optically visible upper conductive portions, and the optically visible conductive upper portions are designed to form part of a same via chain which is designed to be coupled to the substrate.

In an alternative implementation, the expected pattern of voltage potentials include a first voltage potential and a second voltage potential that significantly differs from the first voltage potential, the first voltage potential being adjacent to the second voltage potential. In a further aspect, the first voltage potential corresponds to a first substructure of the structure that is coupled with a substrate and the second voltage potential corresponds with a second substructure of the structure that is not coupled with the substrate. The first substructure is adjacent to the second substructure. In another aspect, the pattern of intensity values correspond to the expected pattern of intensity values of the structure when the first substructure has the first intensity value and the second substructure has the second intensity value. In another embodiment, the pattern of intensity values does not correspond to the expected pattern of intensity values of the structure when the first substructure has a same intensity value as the second substructure. In yet a further aspect, the same intensity value corresponds to a short between the first and second substructures. In one aspect, the first and second substructure each includes a plurality of optically visible upper conductive portions, and the optically visible conductive portions of the first substructure is designed to form part of a same via chain which is designed to be coupled the substrate.

In another embodiment, the invention pertains to an optical inspection system for optically inspecting a semiconductor voltage contrast type structure that is designed to have an expected pattern of voltage potentials during a voltage contrast inspection. The system includes a beam generator for directing an incident optical beam towards a sample surface and a detector positioned to detect a detected optical beam originating from the sample surface in response to the incident optical beam. The system further includes a processor arranged to perform one or more of the above described method operations.

These and other features of the present invention will be presented in more detail in the following specification of the invention and the accompanying figures which illustrate by way of example the principles of the invention.

DETAILED DESCRIPTION OF SPECIFIC EMBODIMENTS

Figure 1:
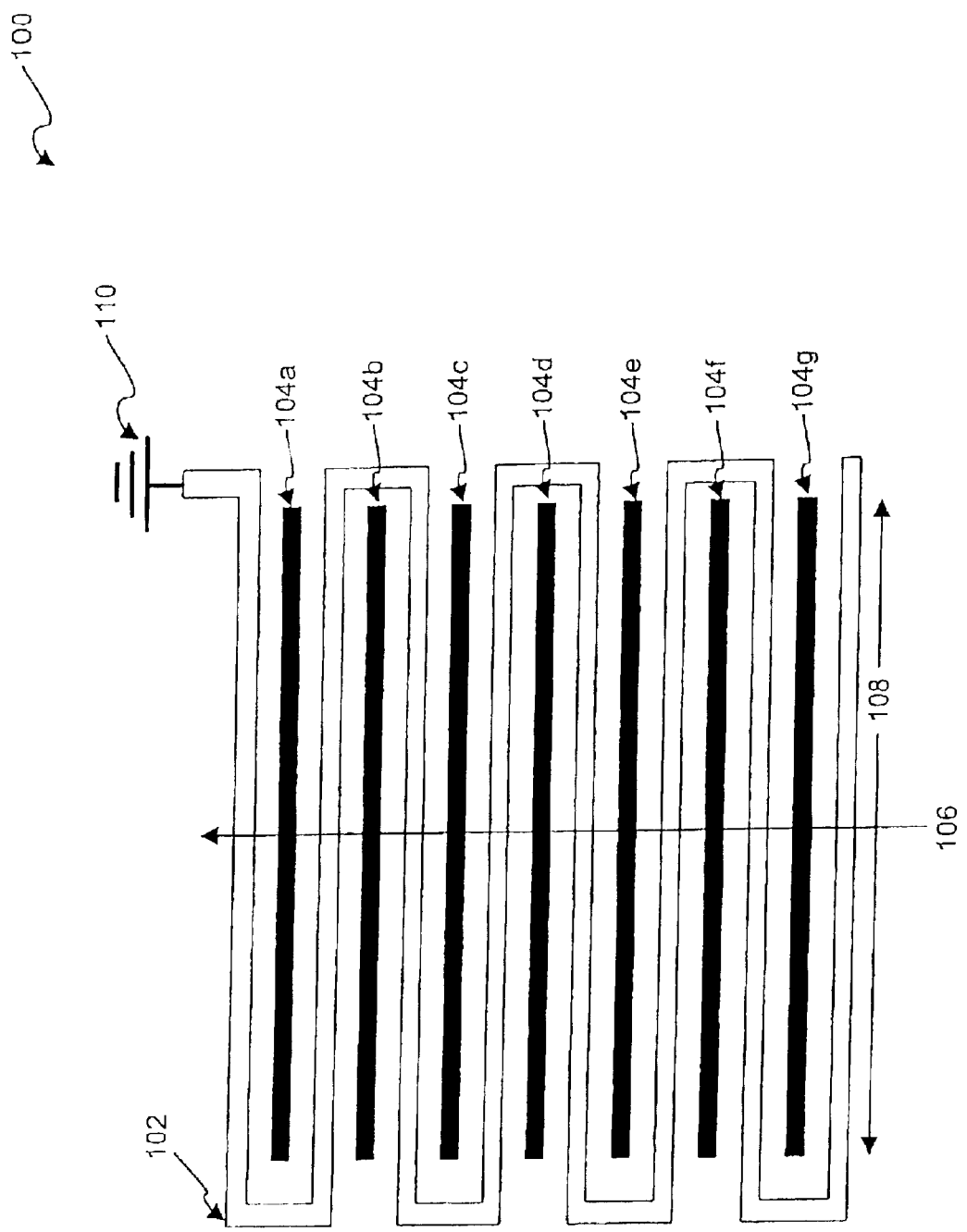
FIG. 1 is a diagrammatic top view representation of an optical image of a first voltage contrast type test structure (referred to as a "serpentine" test structure) in accordance with a first implementation of the present invention.

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In the present invention, defects within particular test structures which were initially designed for a voltage contrast inspection (e.g., with a scanning electron microscope) are optically detected (e.g., with an optical inspection tool such as a microscope). A voltage contrast type test structure is generally designed to produce a first voltage potential pattern and a corresponding intensity pattern within an SEM image when there is no defect present and a second voltage potential pattern and resulting SEM image and a corresponding intensity pattern when there is a defect present. A voltage potential pattern corresponds to a particular pattern of areas on the test structure having particular voltage potential values. For example, particular portions of the test structure may be designed to have a first area with a relatively high voltage potential value and have a second area with a second voltage potential value when there are no defects. By way of another example, the test structure may be designed to have a single voltage potential when there is no defect present.

Using the techniques of the present invention, an optical image of a voltage contrast type test structure having a particular optical intensity pattern is produced when there is no defect and a second optical intensity pattern is produced when there is a defect present. The same voltage type test structure will result in an optical intensity pattern during an optical inspection and a voltage potential pattern during a voltage contrast inspection. The optical intensity pattern obtained during the optical inspection corresponds to the voltage potential pattern obtained during the voltage contrast inspection when there is no defect present. Accordingly, when the resulting optical intensity pattern of a voltage contrast type test structure fails to correspond to its expected voltage potential pattern, it may be determined that there is a defect within the test structure. Alternatively, since the test structure will have a different intensity value pattern when there is a defect, as compared to when there is no defect, one may determine an expected pattern of intensity values for a particular type of test structures. Thus, when an optical inspection of the particular test structure fails to produce an expected pattern of intensity values for such test structure, it may be determined that the is test structure has a defect.

Certain substructures of the test structure which are grounded or coupled to the substrate may result in a relatively bright optical image, while other certain substructures which are left floating (e.g., not coupled to the substrate) may result in a relatively dark optical image. Although not meant to bound by theory, it is believed that particular voltage contrast type test structures will produce a particular pattern of voltage potentials with or without a voltage contrast inspection (e.g., scanning the test structure with an electron beam). These differences in potential, of course, result in a pattern of electrical fields on the test structure. The resulting electric field pattern may affect the optical properties of the underlying test structure portions. Thus, the different voltage potentials may result in different optical intensity values.

The test structures of the present invention may be optically inspected by optical scanning or imaging techniques. FIG. 1 is a diagrammatic top view representation of an optical image of a first voltage contrast type test structure 100 (referred to as a "serpentine" test structure) in accordance with a first implementation of the present invention. As shown, the test structure includes a first substructure 102 that is coupled with a substrate (represented by a ground symbol 110) and a second substructure 104 formed from a plurality of floating conductive lines (e.g., 104a through 104g). That is, the floating substructure 104 is not coupled to the substrate.

During an optical inspection, the first and second substructures are found to have significantly different intensity values. In the illustrated embodiment, the grounded first substructure appears bright, while the floating second substructure appears dark. As an optical beam is passed over a portion of the substructures 102 and 104 (e.g., in direction 106), the substructure 102 that is coupled to the substrate has an intensity value that is significantly brighter than the intensity value of floating substructure 104.

In an alternative implementation, the first substructure may be coupled with a large conductive pad or any other suitably sized conductive structure that results in a different intensity value being produced by the first substructure during an optical inspection, as compared in the second substructure. The large conductive pad of the first substructure has a size that is selected to result in a different intensity when scanned with an optical beam, as compared with the second substructure. Several embodiments of such a test structure having a substructure coupled with a large conductive structure are further described in U.S. Provisional Application No. 60/329,804, filed 17 Oct. 2001, which application is incorporated herein by reference in its entirety.

The size of the conductive pad may be determined experimentally or by simulation. For example, increasing sizes may be used for various conductive pads of test structures to determine whether the test structure's two substructures produce different intensities during an optical inspection. In one embodiment, the size of the conductive pad may be selected to be equal to or greater than the smallest sized conductive pad that experimentally produced differing intensities.

In an alternative implementation, the test structure may be formed from a plurality of parallel conductive lines, instead of a single grounded serpentine via chain interspersed with a plurality of floating conductive lines. Each grounded line is adjacent to a floating line. Each grounded line may be coupled to the substrate or to a relatively large structure or pad.

Figure 2A:
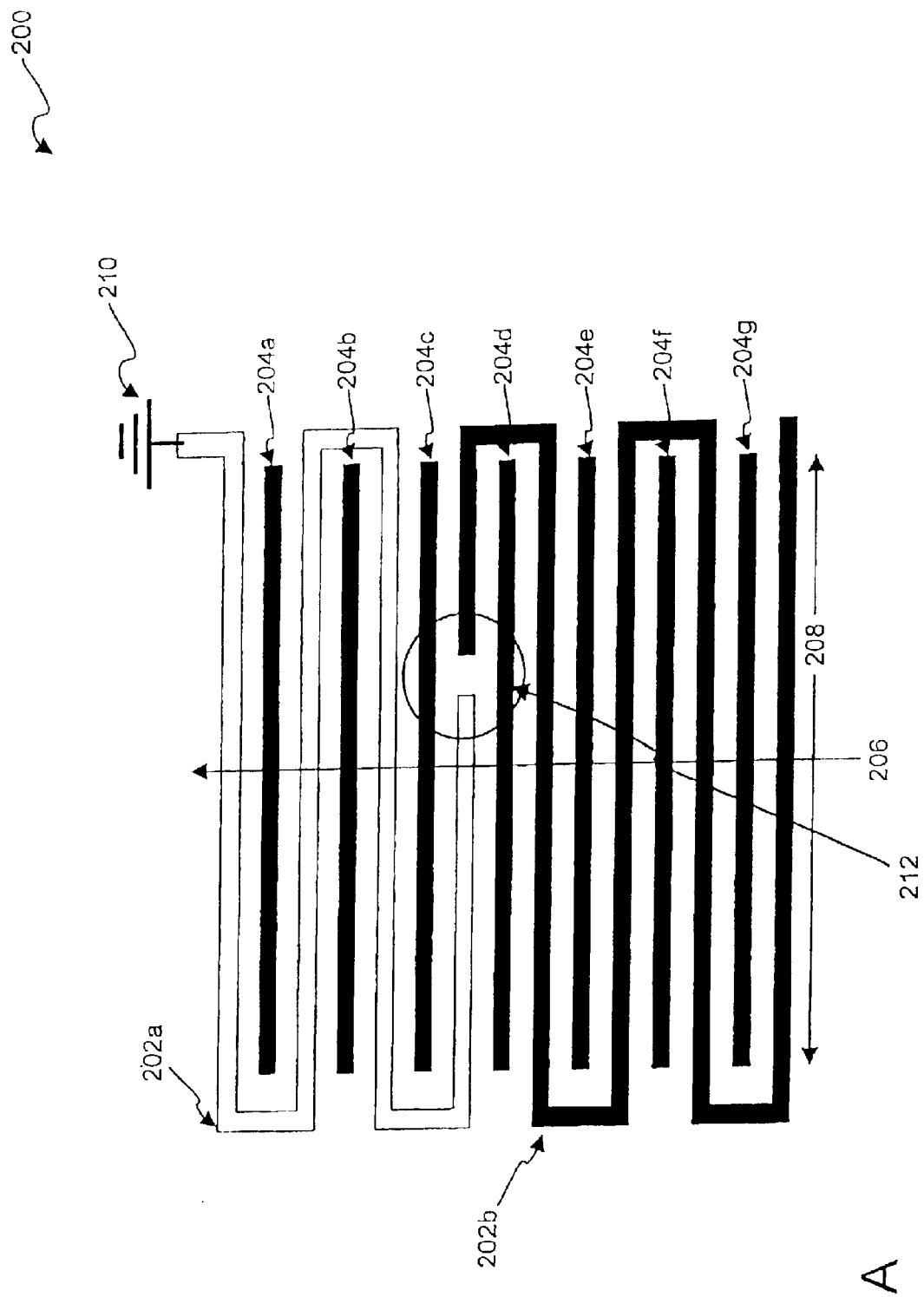
FIG. 2A is a diagrammatic top view representation of an optical image of a serpentine test structure having an open defect in accordance with the first implementation of the present invention.

FIG. 2A is a diagrammatic top view representation of an optical image of a serpentine test structure 200 having an open defect 204 in accordance with the first implementation of the present invention. The test structure 200 of FIG. 2A is similar to the test structure 100 of FIG. 1, except that the test structure 200 of FIG. 2A has an open defect 212. More specifically, the test structure 200 of FIG. 2A includes a first substructure 202 that has the open defect 212 and a second substructure 204 that does not include a defect. The first substructure includes a first portion 202a that remains coupled to the substrate 210 and a second portion 202b that is not coupled to the substrate 210.

One can optically detect an open defect within the first substructure 202. During an optical scan, the portion 202a of the first substructure connected to the substrate 210 may have a different intensity then the portion 202b of the substructure 202 that is not connected to the substrate 210. Hence, the structure displays an optical intensity contrast at the point of the physical break 212. In other words, when an optical beam is scanned, for example, in direction 206 over width 208, the test structure 200 does not have alternating dark and light substructures as expected. The potential difference between the two different portions 202a and 202b of the first substructure may be characterized as an open defect. For some test structures, the entire decoupled portion (e.g., 202b) has a same intensity as the coupled portion (e.g., 202a). However, a dark intensity portion appears at the open defect location s between the two portions 202a and b.

The same principle can be employed for detecting partial opens with the first substructure 202. Under optical beam scanning, the paths to the substrate 210 that contain a partial open may develop intensity differences compared to the paths to the pad 210 which do not have a partial open defect. This intensity difference may be determined to be a partial open defect. A complete open defect may result in a different intensity value in the decoupled portion of the substructure than a partial open defect. For example, if the defect 212 is a complete open, the portion 202b which is completely decoupled from the substrate may have a first intensity value. If the defect 212 is a partial open, the portion 202b which is partially decoupled from the substrate 210 may have a second intensity value that differs from the first intensity value of the open defect portion. Thus, a partial open defect may be distinguished from a complete open defect based on an intensity comparison of such defects.

If the initial optical scan width 208 includes the defect, the specific location of such defect may then be determined by determining where the first substructure transitions between different intensity values. Alternatively, if the initial scan width did not contain the defect, a second scan may be required, for example, along a direction perpendicular to the first scan to determine the defect's specific location.

Figure 2B:
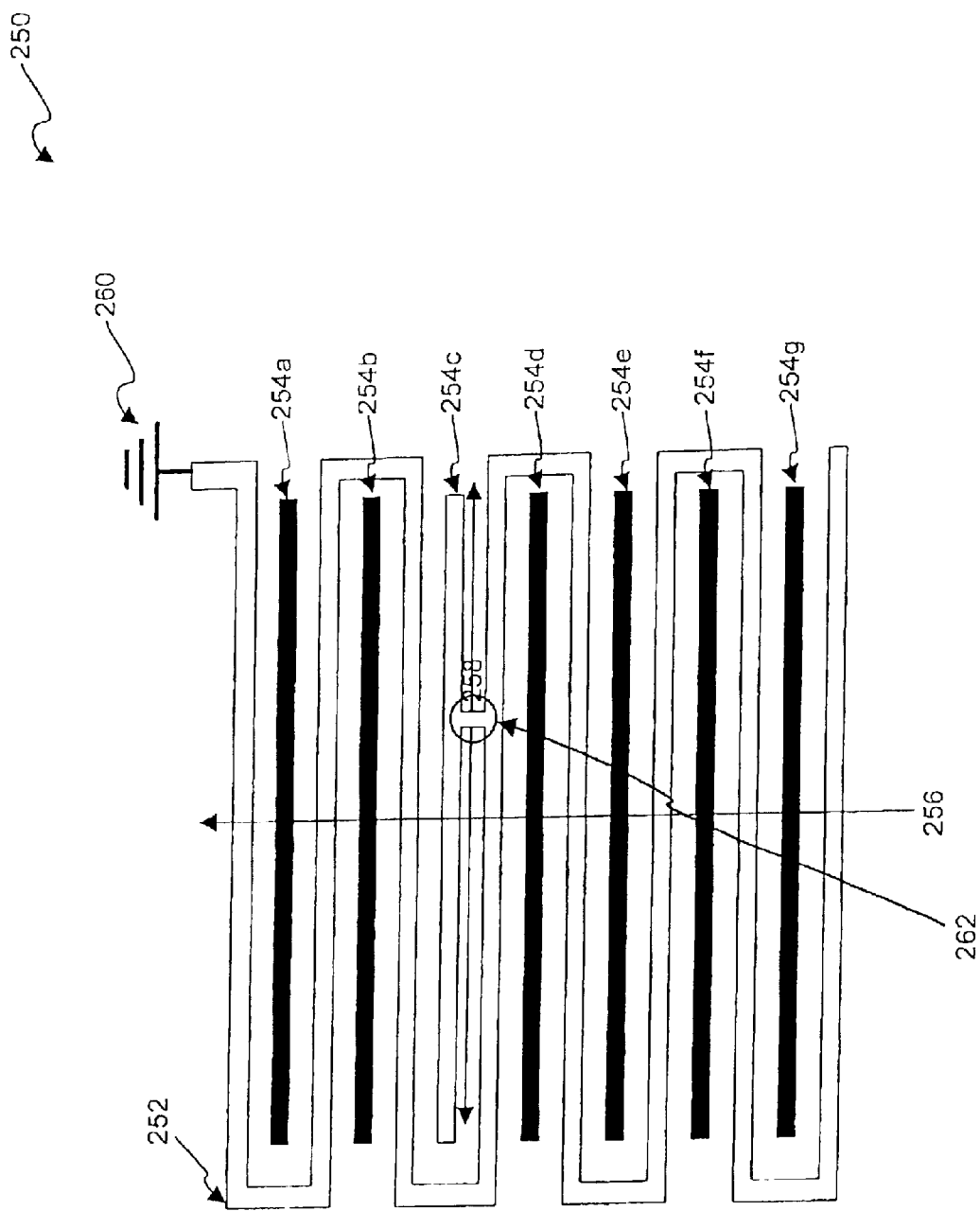
FIG. 2B is a diagrammatic top view representation of an optical image of a serpentine test structure having a short defect in accordance with the first implementation of the present invention.

FIG. 2B is a diagrammatic top view representation of an optical image of a serpentine test structure 250 having a short defect 262 in accordance with the first implementation of the present invention. As shown, the test structure includes a serpentine substructure 252 coupled with substrate 260. The test structure also includes a plurality of conductive line substructures 254, which are designed to remain floating or not coupled to the substrate 560. However, a short defect 262 has occurred between the serpentine substructures 252 and the conductive line 254c. During an optical scan in direction 256, the substructures are expected to have alternating potentials which result in alternating bright and dark lines. However, when two adjacent lines have a same intensity, it is determined that there is a defect in one of the substructures. As shown, the conductive line 254c has the same intensity level as adjacent strips of the serpentine substructure 252. The specific location of the short 262 may be found by scanning along direction 258.

Figure 3A:
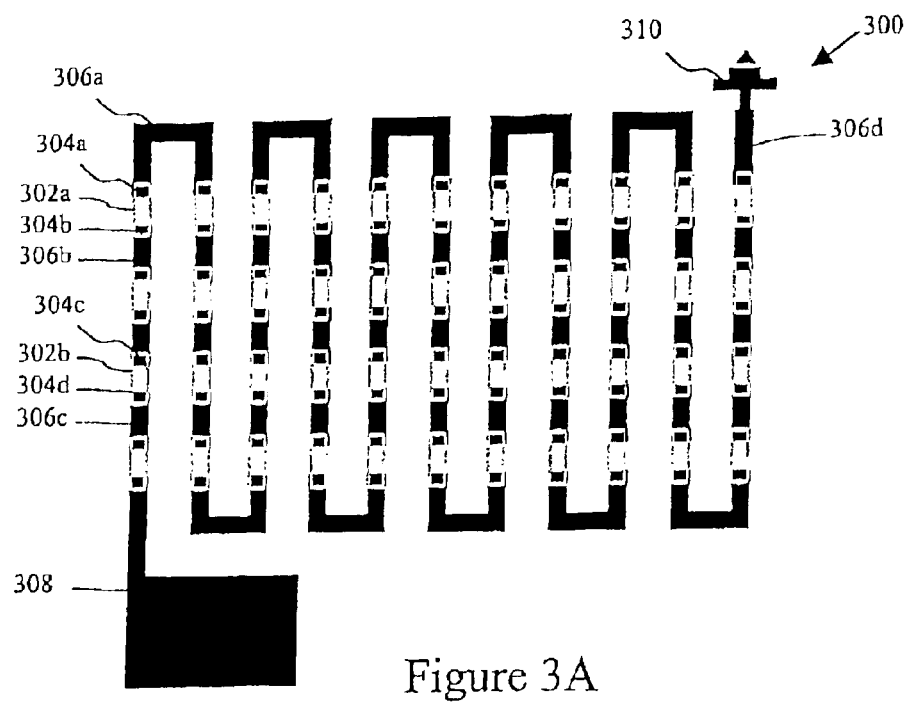
FIG. 3A is a diagrammatic top view of an optical image of a second voltage contrast type test structure (referred to as a "via chain serpentine" test structure) in accordance with a second implementation of the present invention.

FIG. 3A is a diagrammatic top view of an optical image of a second voltage contrast type test structure (referred to as a "via chain serpentine" test structure) in accordance with a second implementation of the present invention. As shown, the test structure 300 includes a plurality of upper conductive substructures 302 which are optically visible. Each upper sub-structure is designed to be coupled to a pair of lower conductive sub-structures 306 through a pair of vias 304. The vias 304 are designed to be filled with a conductive plug. As shown, upper substructure 302a is coupled to underlying substructure 306a through via 304a and coupled to underlying substructure 306b through via 304b.

The upper and lower conductive structures may be formed in any suitable conductive layer of a semiconductor layered structure. For example, the upper conductive substructures 302 may be formed in an exposed metal 2 layer, and the upper substructures are formed in an underlying metal 1 layer. A dielectric layer (not shown) or any suitable insulating material is also deposed between the underlying metal 1 layer and the upper metal 2 layer 302.

As shown, the plurality of lower sub-structures 306 and upper substructures 302 are designed to be coupled together to form a serpentine chain. One end of the serpentine chain is designed to be coupled to the substrate (represented by ground symbol 310) through lower substructure 306d, while the other end of the chain is designed to be coupled to a probe pad 308. The probe pad 308 is optional.

The test structure 300 contains no defects. That is, the upper substructures 304 are coupled together through the lower substructures 306 and vias 304 to the substrate 310 without a break or open defect. Accordingly, the optically visible upper substructures are imaged as having the same intensity values (e.g., bright) in the optical image of FIG. 3A.

In an alternative via chain implementation, the test structure may be formed from a plurality of parallel via chains, instead of a single serpentine via chain. Each via chain is adjacent to another via chain. At least one end of each via chain is coupled to the substrate or a relatively large conductive pad as described above. Alternatively, the via chains may include interleaved grounded and floating chains.

In alternative serpentine structure embodiments, the test structure may include two adjacent serpentine conductive lines. One line is designed to be coupled to the substrate and the other conductive line is designed to remain floating and not coupled to the substrate. One or more of the lines may be formed completely from an upper conductive layer or from a via chain which couples one or more conductive layers.

Figure 3B:
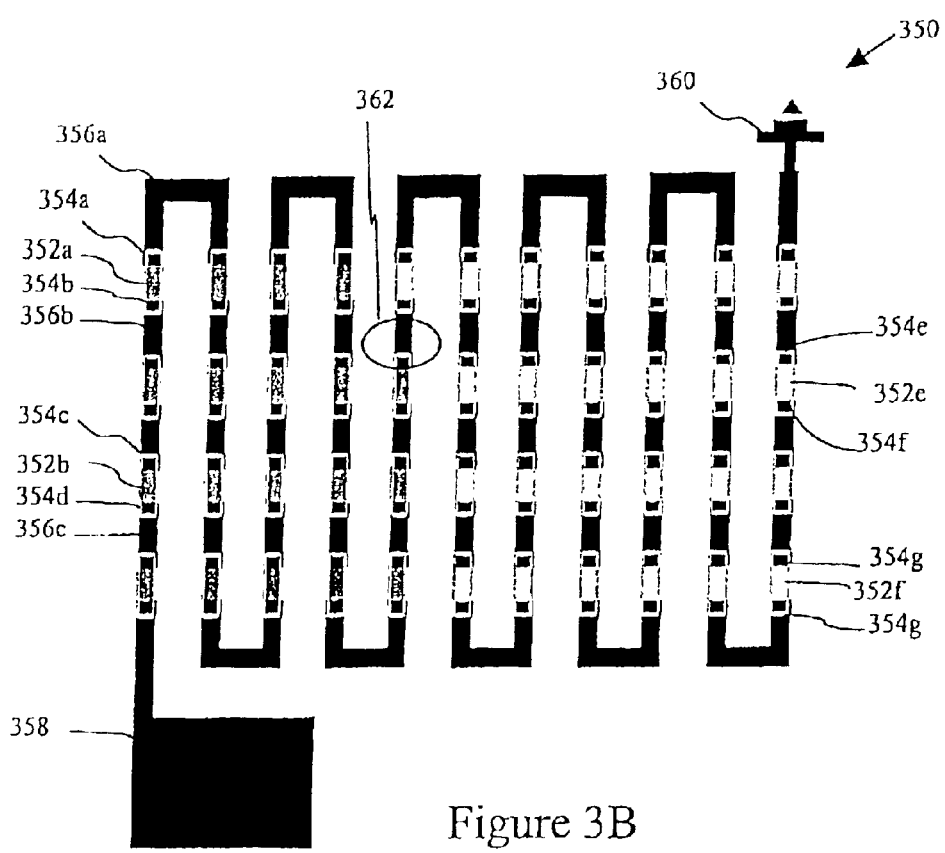
FIG. 3B is a diagrammatic top view of an optical image of a via chain serpentine test structure having an open defect with the second implementation of the present invention.

FIG. 3B is a diagrammatic top view of an optical image of a via chain serpentine test structure 350 having an open defect 362 with the second implementation of the present invention. The open defect 362 causes some of the upper sub-structures to become de-coupled from the substrate (represented by ground symbol 360). For example, upper sub-structures 352a and 352b are not coupled to the substrate 360, while upper sub-structures 352e and 352f are coupled to the substrate 360.

When an image is formed from test structure 350, the upper sub-structures that are not coupled to the substrate have a different intensity than the upper sub-structures which remain coupled to the substrate 360. In the illustrated embodiment, the floating upper sub-structures appear dark, while the grounded upper sub-structures appear bright. This pattern of optical intensity values fails to match the expected pattern of voltage potentials for this test structure. That is, the test structure 350 fails to maintain a single optical intensity value during the optical inspection, which optical pattern would also fails to correspond to the expected pattern of a single voltage potential for the entire test structure. Since in this embodiment all of the upper sub-structures are expected to appear bright (to match the expected voltage potential pattern of a single high voltage potential) when the test structure does not have any defects, it may be determined that the test structure 350 has a defect when any of the upper sub-structures appear dark. The location of the defect 362 corresponds to the location where there is a transition between bright and dark intensity values of a pair of upper sub-structures. For some test structures, the entire decoupled portion of the via chain has a same intensity as the coupled portion of the via chain. However, a dark intensity portion appears at the open defect location between the two portions.

Figure 3C:
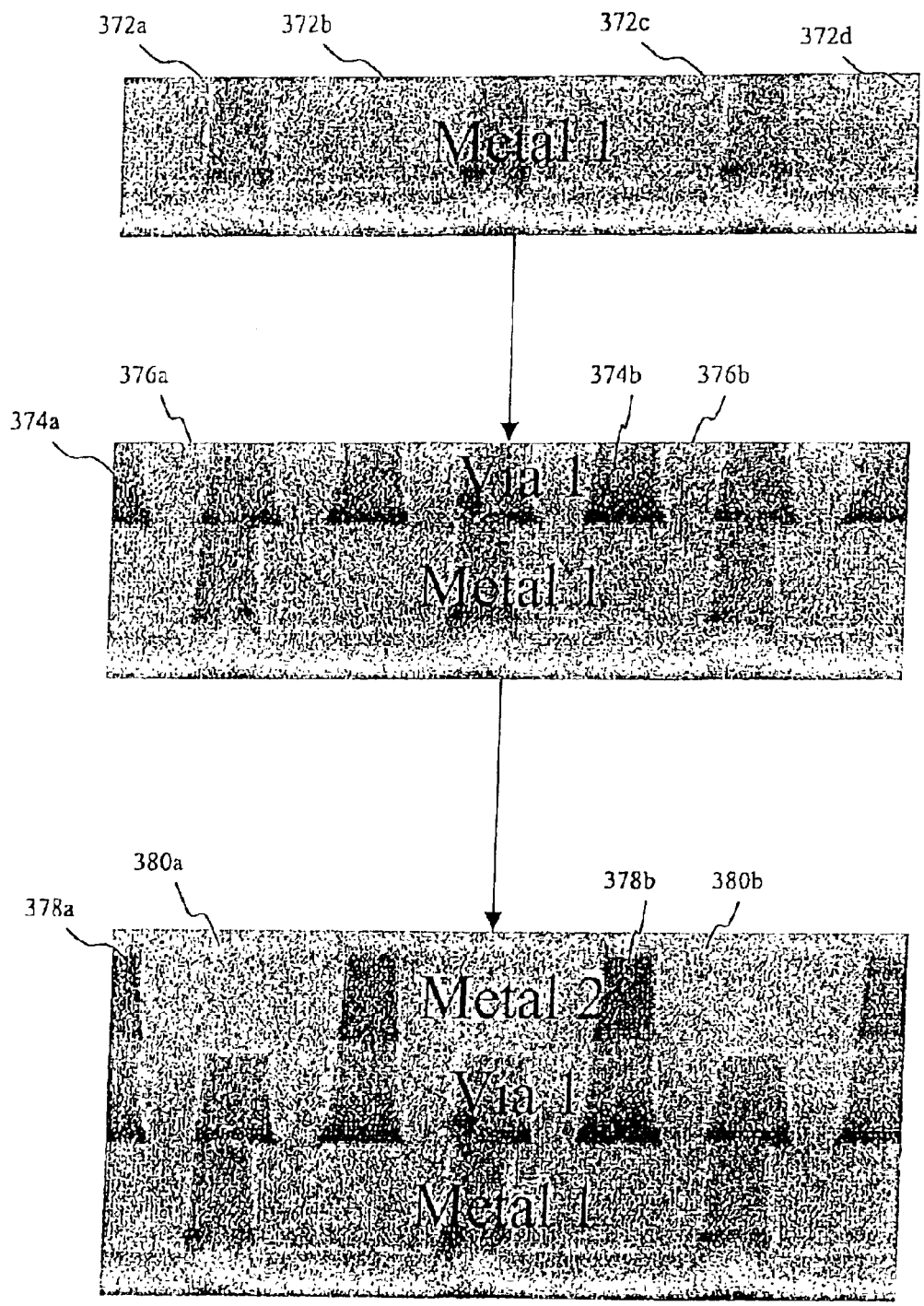
FIG. 3C includes three cross-sectional images which each show a portion of a via chain test structure after sequential fabrication steps of a single damascene process.
Figure 4A:
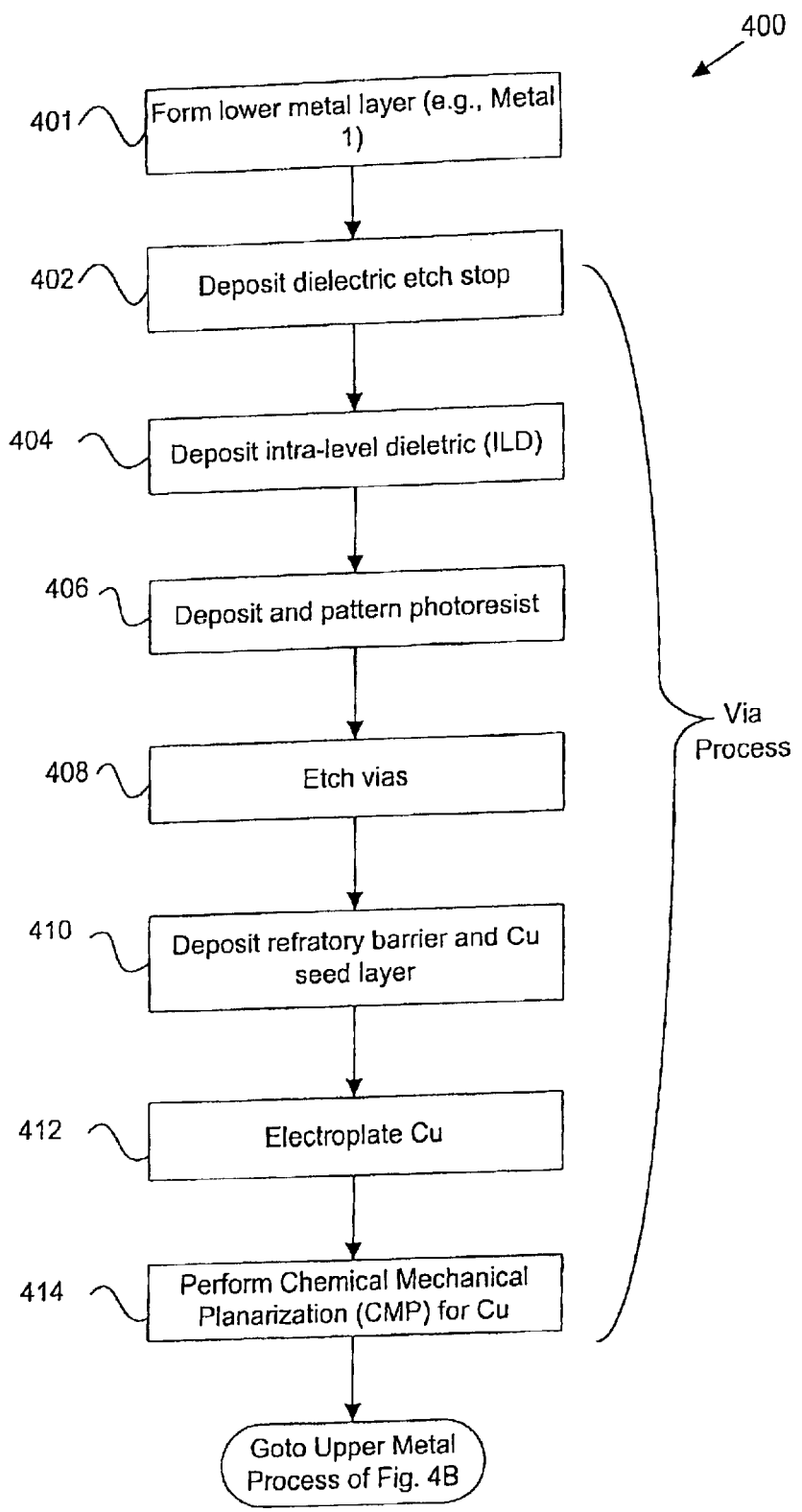
FIGS. 4A through 4B show a flow chart of a single damascene procedure for fabricating the test structure of FIG. 3C.
Figure 4B:
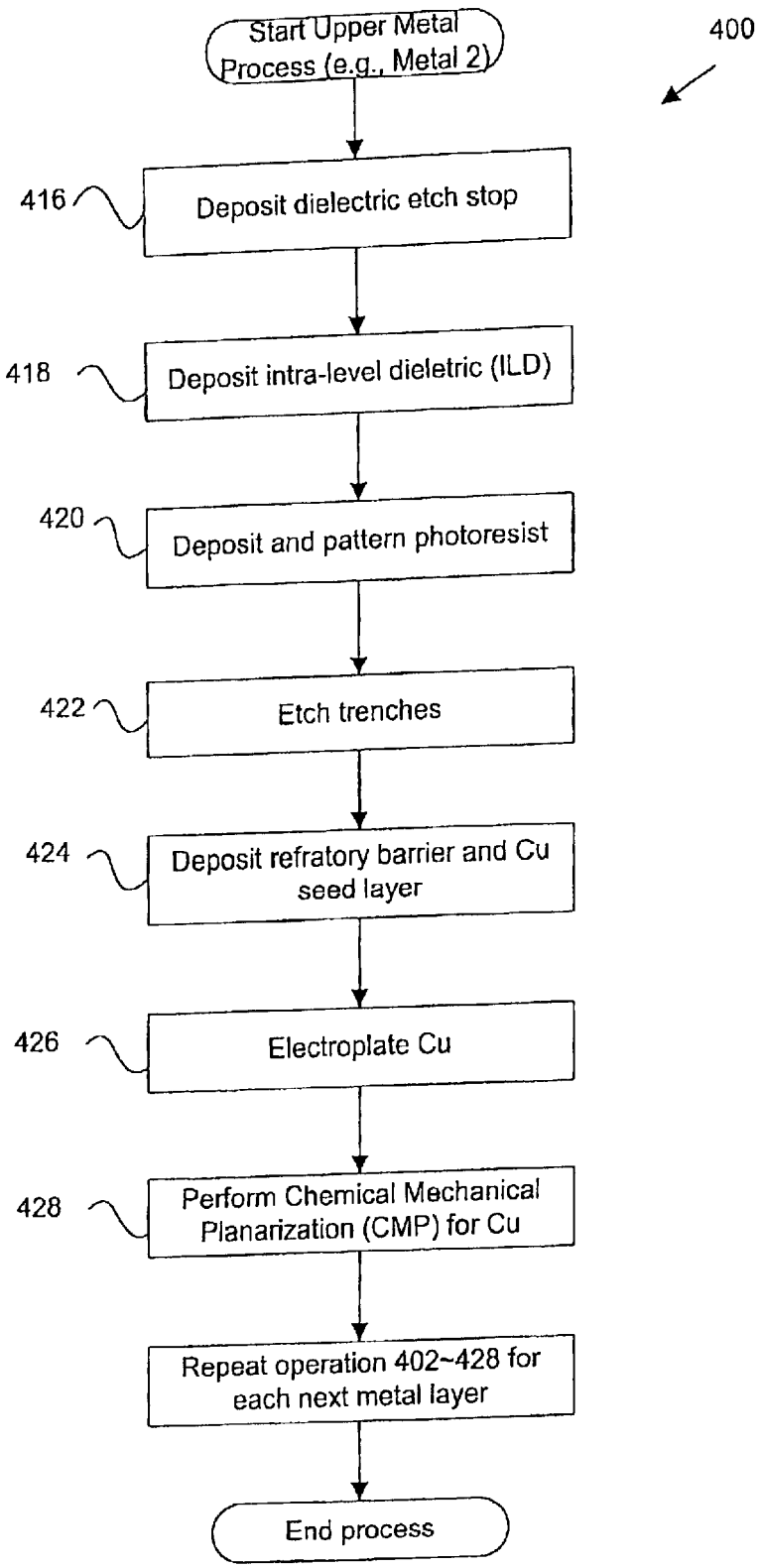

FIG. 3C includes three cross-sectional images which each show a portion of a via chain test structure after sequential fabrication steps of a single damascene process. FIGS. 4A through 4B show a flow chart of a single damascene procedure 400 for fabricating the test structure of FIG. 3C. As shown in FIG. 4A, a lower metal layer (e.g., metal 1) is initially formed in operation 401. Although it is believed that the test structure may include any suitable conductive material, the test structures are preferably formed from copper conductive layers. The conductive lower metal layer, as well as any other conductive layers of the test, may be formed using any suitable fabrication technique. In the illustrated embodiment of FIG. 3C and FIGS. 4A and 4B, the conductive layers are formed using a single damascene process, which technique is described further below for the upper dielectric and metal layer (e.g., metal 2).

A dielectric etch stop is then deposited over the lower conductive layer in operation 402. A dielectric is then deposited in operation 404. A photoresist layer is then deposited and patterned in operation 406. Vias are then etched in operation 408. A refractory barrier and copper seed layer is then deposited in operation 410. The copper layer is then electroplated in operation 412. A chemical mechanical planarazation (CMP) is then performed for the copper layer in operation 414. Operations 402 through 414 may be used to form the via portions 376 illustrated in FIG. 3C.

The procedure 400 then proceeds to an upper conductive layer (e.g., metal 2) process in FIG. 4B. A dielectric etch stop is deposited in operation 416. An intra-level dielectric (ILD) is then deposited in operation 418. A photoresist layer is then deposited and patterned in operation 420. A plurality of trenches are then etched in operation 422. A refractory barrier and copper seed layer are then deposited in operation 424. The copper is then electroplated in operation 426. CMP is then performed for the copper in operation 428. Operations 416 to 428 may be used to form the upper metal portions 380 formed within the dielectric layer 378 which are filled with a copper conductive plug as illustrated in FIG. 3C. Operations 402 through 428 may be repeated for any subsequent upper conductive layers in the test structure in operation 430. The process 400 for fabricating the test structure of FIG. 3C then ends.

A dielectric layer may be formed from any suitable insulating material, such as (Flourinated Silicate Glass) FSG or (OrganoSilicate Glass) OSG. The barrier layer may be composed of any suitable material which prevents diffusion of the copper material into the underlying dielectric. By way of examples, the barrier layer may include nitrides, oxynitrides and suicides of Ti, W, Ta, and Co, such as TiN and Ta or TaN. The copper seed layer may be formed from pure copper or a copper alloy. Any suitable deposition process may be used for the copper layers, such as PVD (plasma vapor deposition), MOCVD (Oxide Metalorganic Chemical Vapor Deposition), or ECD (electrochemical deposition).

Figure 3D:
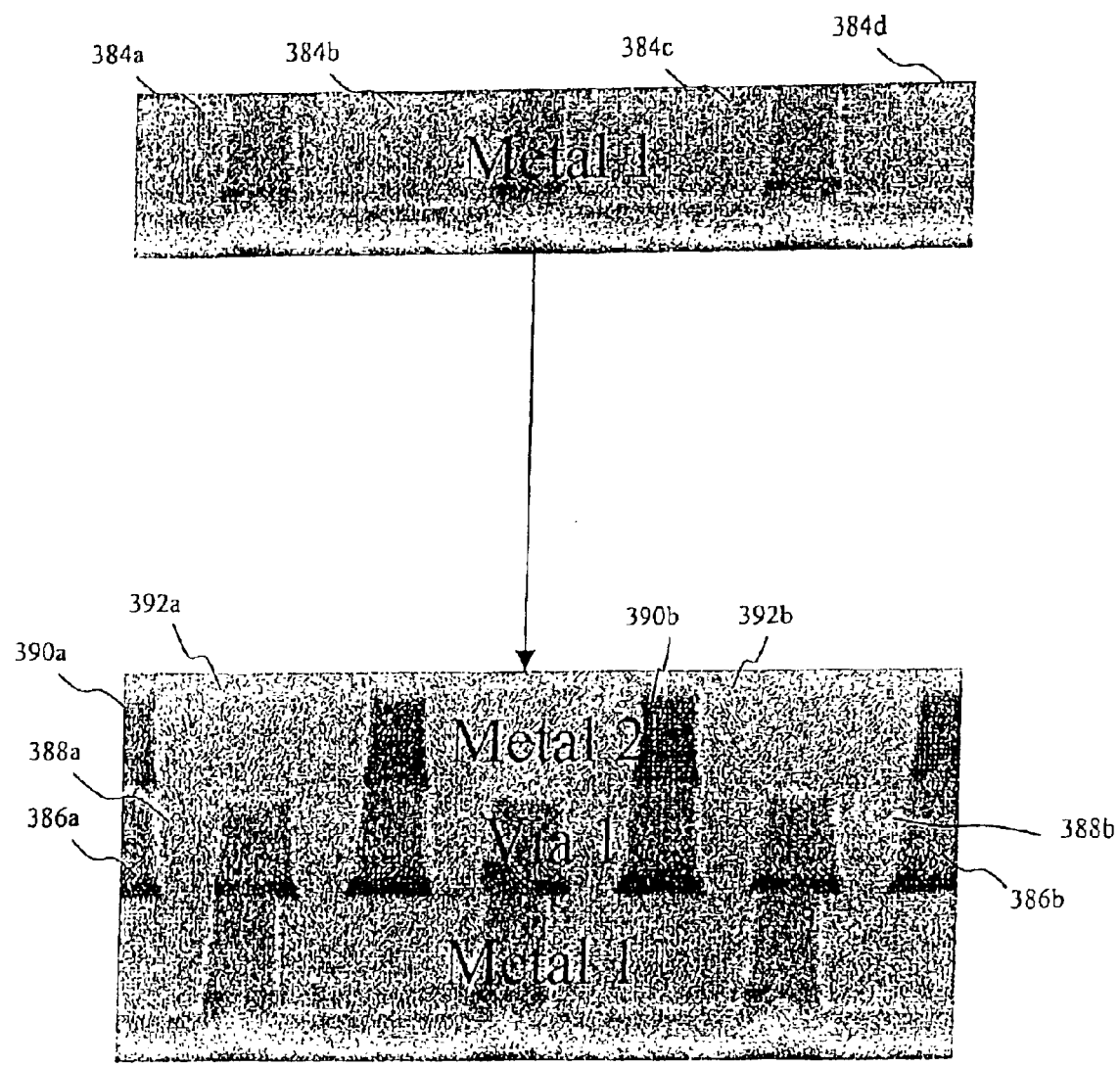
FIG. 3D includes two cross-sectional images which show a portion of a via chain test structure after sequential fabrication steps of a dual damascene process.
Figure 5A:
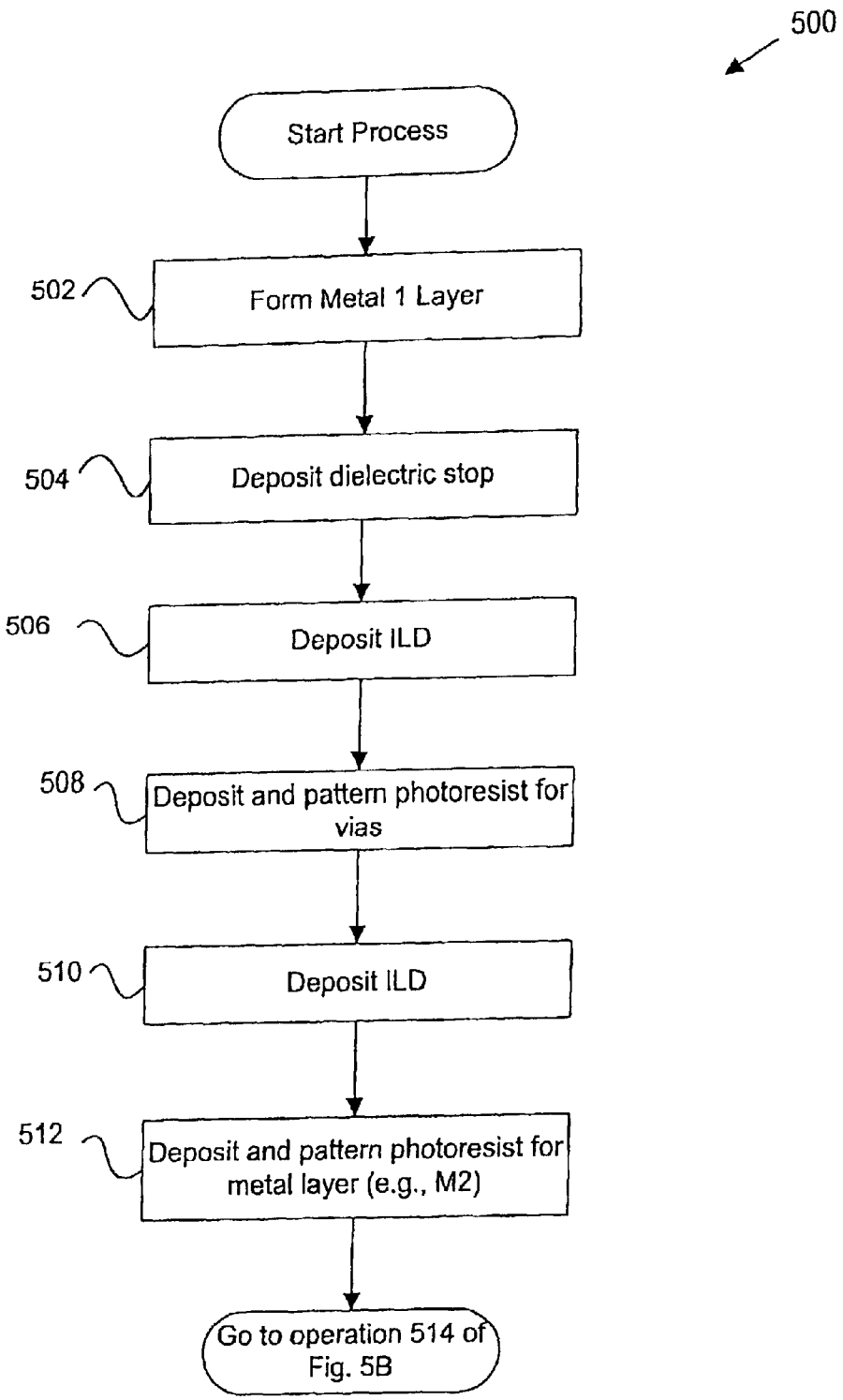
FIGS. 5A through 5B show a flow chart of a dual damascene procedure for fabricating the test structure of FIG. 3D.
Figure 5B:
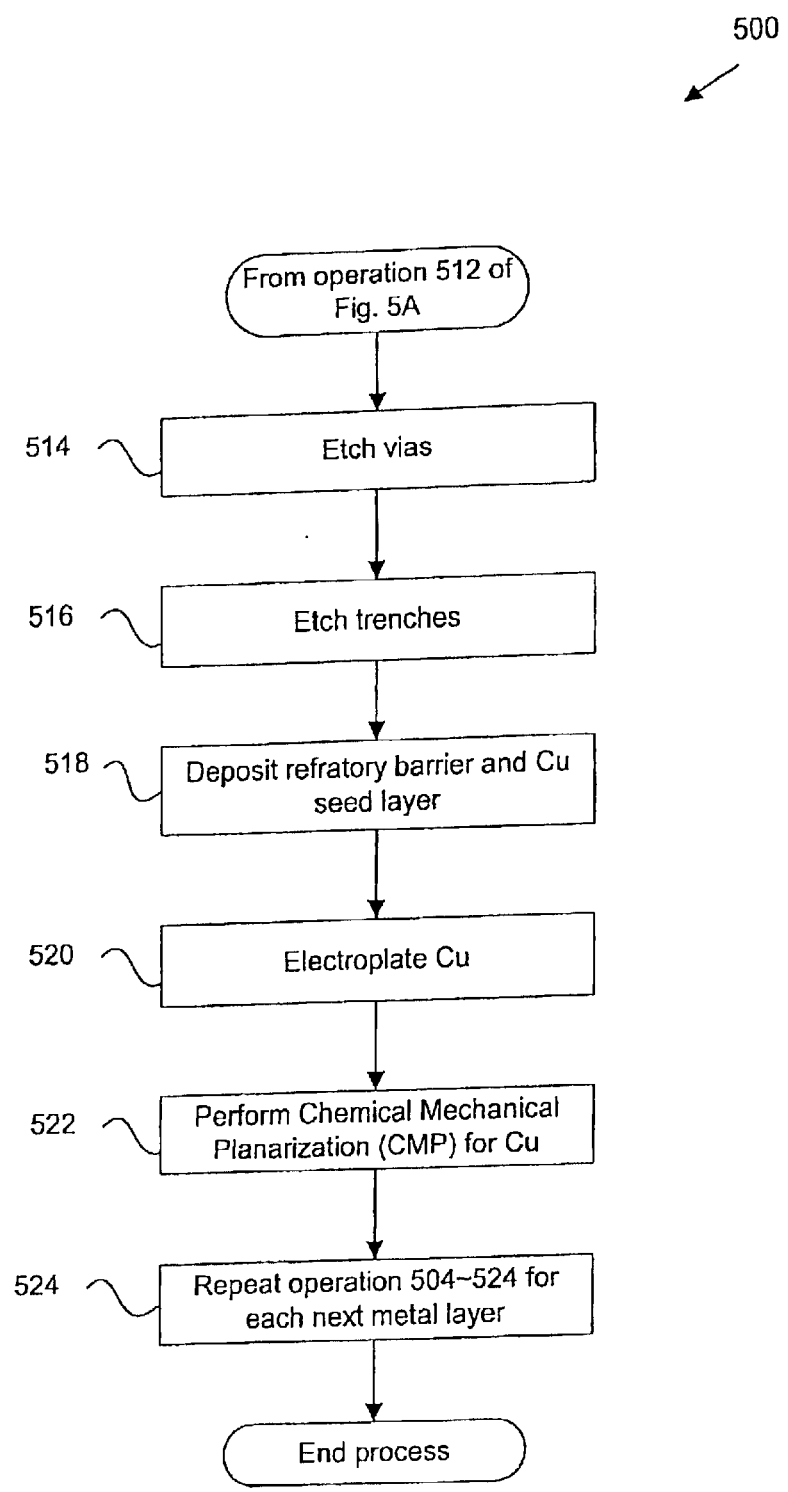

The conductive layers of the test structure may alternatively be fabricated using any suitable dual damascene process. FIG. 3D includes two cross-sectional images which show a portion of a via chain test structure after sequential fabrication steps of a dual damascene process. FIGS. 5A through 5B show a flow chart of a dual damascene procedure 500 for fabricating the test structure of FIG. 3D. Of course, other conventional dual damascene processes may be utilized. As shown in FIG. 5A, a metal 1 layer is formed in operation 502. For example, the metal 1 portions 384 of FIG. 3D are formed. A dielectric stop layer is then deposited in operation 504. An ILD layer is then deposited in operation 506. A photoresist layer for a plurality of vias is then deposited and patterned in operation 508. A second ILD layer is then deposited in operation 510. A photoresist layer for the upper metal layer is then deposited and patterned in operation 512. The procedure 500 then proceeds to operation 514 of FIG. 5B. Alternatively, a nitride layer may be etched for the vias and upper metal portions.

A plurality of vias are then etched within the lower ILD layer in operation 514. A plurality of trenches are also etched within the upper ILD layer in operation 516. The vias and trenches are typically formed in a single etch process. A refractory barrier and copper seed layer are then deposited in operation 518. This copper seed layer is then electroplated and CMP is performed in operations 520 and 522, respectively. Operations 502 through 524 may be used to form the vias 388 within the lower dielectric layer 386 which are filled with a conductive copper plug of FIG. 3D. These operations may also be used to form the upper metal 2 portions 392 within the upper dielectric layer 390 of FIG. 3D. Operations 504 through 522 may be repeated for any number of additional upper metal layers in operation 524. The process for fabricating the test structure of FIG. 3D then ends.

The test structures utilized for the inspection techniques of the present invention preferably include a minimized distance between substructures. For example, there is minimum distance between each conductive line and its adjacent serpentine conductive line portion or between two adjacent via chain portions. Preferably, the spacing between each pair of substructures, e.g., via chains, is a minimum design distance and the line widths are minimum design widths. That is, the test structures are densely packed. In one embodiment, the spacing is equal or less than about 0.36 μm. In this embodiment, the line widths are also less than or equal to about 0.36 μm. In one implementation, the height of each test structure is selected to allow an image of the entire test structure to be captured in a single snap shot and for quick defect location time. In another implementation, there is a constant distance between via chain ground locations to ease the determination procedure for identifying the test structure border, as described further below with respect to FIG. 6.

The optical techniques of the present invention may be applied to test structures formed from other types of fabrication processes besides damascene. For example, the test structure may include conductive layers formed from other conductive materials, such as W, Al, or Al alloys. By way of another example, the test structure may include conductive layers formed from copper or copper alloys which were fabricated using a pattern etch technique or a dry etch process.

The test structure may also include a uniform cap layer over the upper conductive structures. The uniform dielectric layer material and thickness are selected so that the underlying upper conductive portions remain optically visible. In one implementation, a carbide or nitride protective cap is used after a CMP step. For example, a 500~1000 Å $Si_3N_4$ layer may be used.

Figure 6:
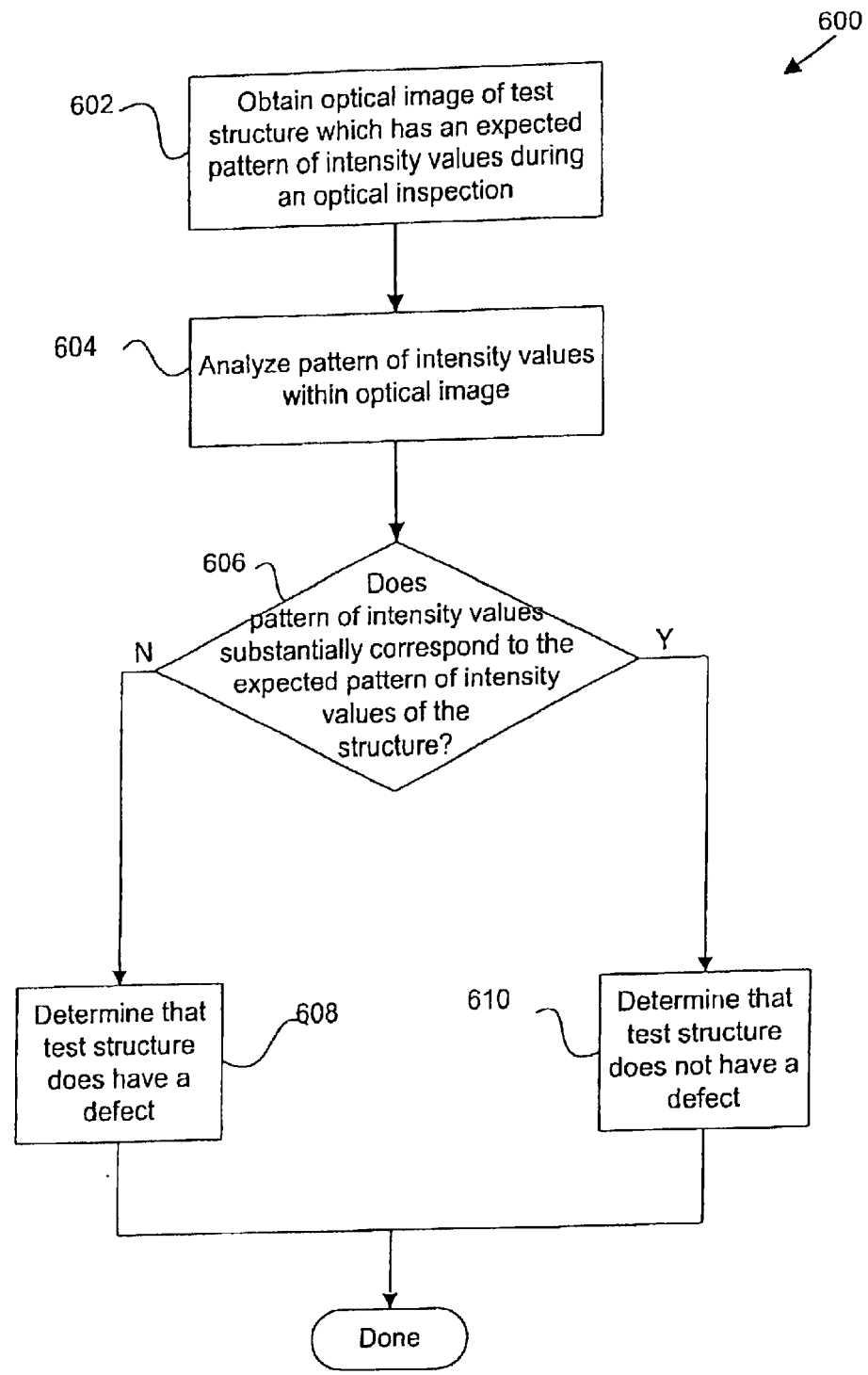
FIG. 6 is a flowchart illustrating a procedure for optically inspecting a voltage contrast type test structure or other type of semiconductor device in accordance with one embodiment of the present invention.

FIG. 6 is a flowchart illustrating a procedure 600 for optically inspecting a voltage contrast type test structure or other type of semiconductor device in accordance with one embodiment of the present invention. Initially, an optical image of a test structure is obtained which has an expected pattern of intensity values during an optical inspection in operation 602. A recipe within the optical tool may be created or modified to identify a particular test structure type. For example, "care areas" may first be set to include an entire via chain. The grounded ends of such via chain may then be manually or automatically identified to signify the via chain border location in each care area. A snap shot of the entire a particular test structure, such as a via chain, may then be captured using the recipe for the particular test structure.

A pattern of intensity values within the optical image is then analyzed in operation 604. It is then determined whether the pattern of intensity values substantially correspond to the expected pattern of intensity values of the structure in operation 606. In a via chain structure as illustrated in FIG. 3A, the intensity profile of the via chain is analyzed to determine whether low intensity values or "valleys" exist within the intensity profile of the via chain. The ground locations identified in the recipe may be used to filter via chain module boundary fails from the valleys. Any remaining valleys are then defined as defects within the via chain since the via chain is expected to have a uniform high intensity value.

If the intensity values correspond to the expected pattern (e.g., no intensity valleys), it is determined that the test structure does not have a defect in operation 610. If the intensity values do not correspond to the expected pattern of intensity values of the test structure, it is determined that the test structure does have a defect in operation 608. The procedure 600 may then end.

This inspection technique may be used to detect any suitable type of defect. By way of example, the defect may be an open type defect or a short type defect. An open defect may include a complete or partial open within any part of the test structure, such as within a conductive line, a trench, or a via/plug. It has been found that different types of defects will result in different intensity values such that the different types of defects may be distinguished from each other. For instance, a complete open will result in a first intensity; a partial open will result in a second intensity; and a short will result in a third intensity.

Additionally, the location of each defect may be determined by analyzing the image further to determine where the test structure deviates from the expected pattern. For example, an open within the serpentine via chain may be found by finding a transition between light and dark upper conductive portions of the serpentine via chain. The defect may then be determined to be located between or within such transitioning upper conductive structures.

In particular types of voltage contrast test structures, a defect may be located by performing a search that minimizes search time. In one embodiment of the present invention, a defect may be located by stepping to various locations on the test structure, rather than continuously scanning along, for example, the entire length of the test structure. At each step location, the test structure is scanned by the optical beam. This "accelerated search" technique may be implemented on any suitable test structure, in addition to the above described test structures. One example of such an accelerated search is a binary search. Of course, any suitable search step may be utilized to quickly "step" to the defect's location in one or more steps. For example, the optical beam may be moved relative to the test structure in predefined incremental distances.

Any suitable optical tool may be used to implement the inspection techniques of the present invention. By way of examples, the optical tool may use a broadband or laser source. Preferably, a high enough magnification is used to optically detect defects within the test structure. The magnification level may be determined experimentally with test structures having known defects. That is, the magnification level of the optical tool is incrementally increased until the known defects become optically recognizable using the optical tool. A magnification of 20× and 50× works well. Specific examples of suitable optical inspection systems include an AIT-XP system or a CRS 3000 system by KLA-Tencor, Corporation of San Jose, Calif.

Figure 7:
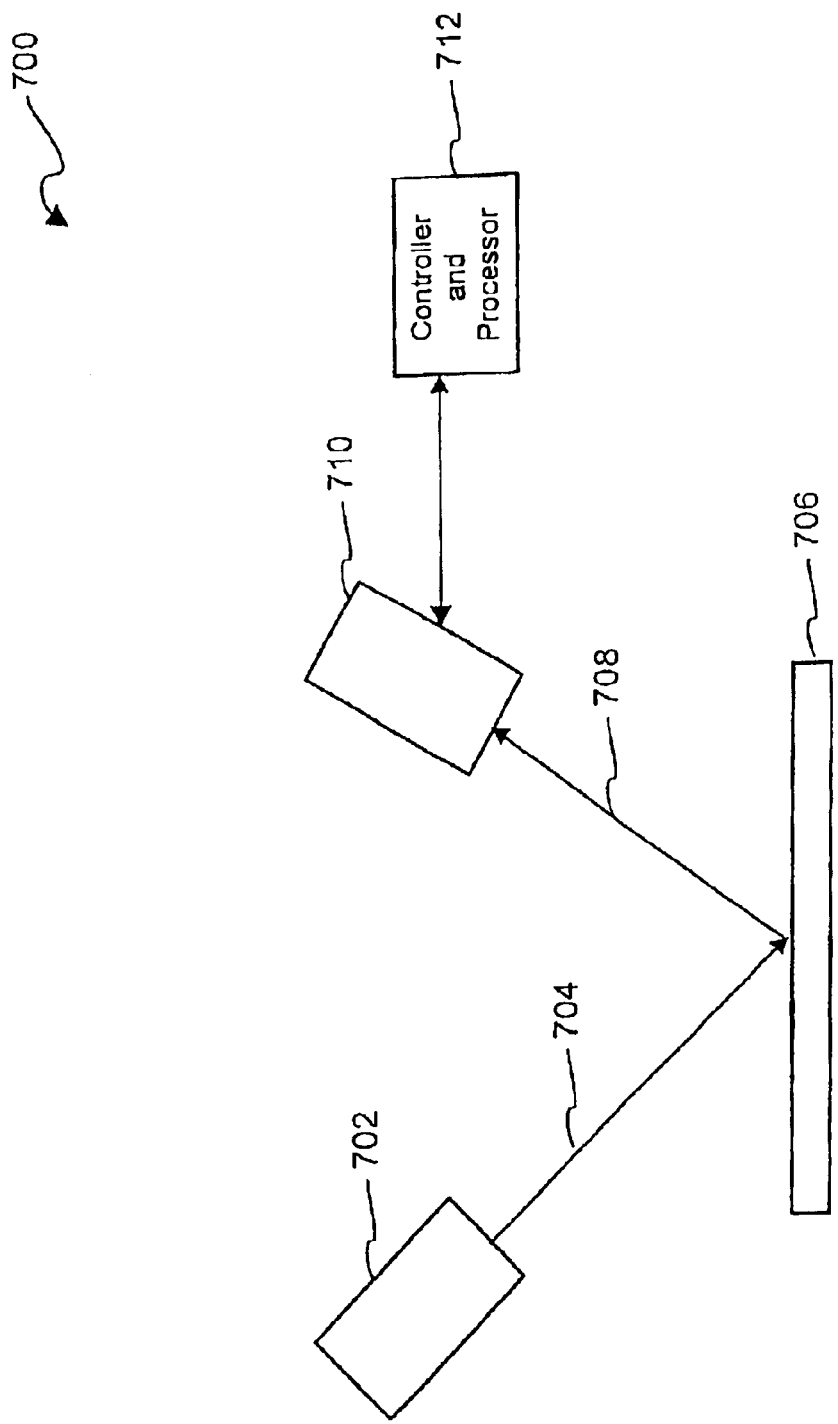
FIG. 7 is a diagrammatic representation of an optical system in which the techniques of the present invention may be implemented.

FIG. 7 is a simplified diagrammatic representation of an optical system in which the techniques of the present invention may be implemented. The detail in FIG. 7 is provided for illustrative purposes. One skilled in the art would understand that variations to the system shown in FIG. 7 fall within the scope of the present invention. AS shown, the optical system of FIG. 7 includes a beam generator 702 for emitting and directing an optical beam 704 (e.g., broadband or laser) towards sample 706, e.g., a wafer containing a voltage contrast type test structure. An optical beam 708 is then reflected or scattered from the sample 706 onto detector 710. The detector 710 generates an intensity signal or image corresponding to the reflected or scattered beam 708 from sample 706 and outputs the intensity signal or image signal to controller and processor 712. The processor/controller 712 may include a variety of processors, storage elements, and input and output devices. The processor/controller may be configured to implement the defect detection and location techniques of the present invention. The processor/controller may also be configured to correlate the coordinates of the optical beam with respect to the sample with coordinates on the sample to thereby determine, for example, a location of a determined defect. Additionally, the controller/processor may control various operating conditions of the optical system, such as focus, position, and magnification. In one embodiment, the processor/controller is a computer system having a processor and one or more memory devices.

Regardless of the controller's configuration, it may employ one or more memories or memory modules configured to store data, program instructions for the general-purpose inspection operations and/or the inventive techniques described herein. The program instructions may control the operation of an operating system and/or one or more applications, for example. The memory or memories may also be configured to store images of scanned samples, reference images, defect classification and position data, as well as values for particular operating parameters of the inspection system.

Because such information and program instructions may be employed to implement the systems/methods described herein, the present invention relates to machine readable media that include program instructions, state information, etc. for performing various operations described herein. Examples of machine-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). The invention may also be embodied in a carrier wave travelling over an appropriate medium such as airwaves, optical lines, electric lines, etc. Examples of program instructions include both machine code, such as produced by a compiler, and files containing higher level code that may be executed by the computer using an interpreter.

Any other suitable defect location may be utilized with the above describe optical inspection techniques. For example, voltage contrast inspection techniques may be modified and used with the above described optical inspection techniques. Several defect presence detection and defect location techniques are described in co-pending (1) U.S. Pat. No. 6,528,818, issued 4 Mar. 2003, (2) U.S. patent application Ser. No. 09/999,843, filed 24 Oct. 2001, (3) U.S. Pat. No. 6,642,726, issued 4 Nov. 2003 (4) U.S. patent application Ser. No. 09/991,188, filed 14 Nov. 2001, (5) U.S. Provisional Application No. 60/329,804 filed 17 Oct. 2001, (6) U.S. Provisional Application Nos. 60/329,806, filed 17 Oct. 2001 (7) 60/329,986, filed 17 Oct. 2001. These applications are incorporated herein in their entirety. Additionally, the optical inspection techniques may be utilized on other types of test structures which were designed for a voltage control contrast type inspection. Several suitable test structures are also described in detail in the above referenced patent applications (1) through (7).

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. A method of optically inspecting a semiconductor voltage contrast type structure, comprising:

providing a semiconductor voltage contrast type structure that is designed to have an expected pattern of voltage potentials that would result in an expected pattern of bright and dark areas during a voltage contrast inspection;

during an optical inspection, obtaining an optical image of the voltage contrast the structure, wherein the optical image has a pattern of specific dark and bright areas;

when the pattern of dark and bright areas of the optical image fail to substantially correspond to the expected pattern of dark and bright areas which are expected to occur during a voltage contrast inspection, determining that the structure has an electrical defect; and when the pattern of bright and dark areas of the optical image substantially correspond to the expected pattern of dark and bright areas which are expected to occur during a voltage contrast inspection, determining that the structure does not have an electrical defect.

2. A method as recited in claim 1, wherein the expected pattern of dark and bright areas are comprised of either all dark areas or all bright areas on the test structure.

3. A method as recited in claim 2, wherein the expected pattern of dark and bright areas include a first dark area and a second bright area, the first dark area being adjacent to the second bright area.

4. A method as recited in claim 3, wherein either the first dark area or the second bright area corresponds to a first substructure of the structure that is coupled with a substrate and the other of either the first dark area or the second bright area corresponds with a second substructure of the structure that is not coupled with the substrate, wherein the first substructure is adjacent to the second substructure.

5. A method as recited in claim 4, wherein the pattern of dark and bright areas of the optical image correspond to the expected pattern of dark and bright areas of the structure when the first substructure corresponds to the first dark area and the second substructure corresponds to the second bright area or the first substructure corresponds to the second bright area and the second substructure corresponds to the first dark area.

6. A method as recited in claim 5, wherein the pattern of dark and bright areas of the optical image does not correspond to the expected pattern of dark and bright areas of the structure when the first substructure has a substantially same intensity value as the second substructure.

7. A method as recited in claim 6, wherein the same intensity value corresponds to an electrical short between the first and second substructures.

8. A method as recited in claim 2, wherein the pattern of dark and bright areas of the optical image correspond to the expected pattern of dark and bright areas of the structure when the pattern of dark and bright areas of the optical image have a substantially same intensity value.

9. A method as recited in claim 8, wherein the expected pattern of dark and bright areas correspond to a portion of the structure that is coupled with a substrate.

10. A method as recited in claim 9, wherein the pattern of dark and bright areas of the optical image correspond to the expected pattern of dark and bright areas of the structure when the pattern of intensity values have a same relatively bright intensity value.

11. A method as recited in claim 9, wherein the structure includes a plurality of optically visible upper conductive portions.

12. A method as recited in claim 9, wherein the pattern of dark and bright areas of the optical image does not correspond to the expected pattern of dark and bright areas of the structure when the pattern of dark and bright areas include another intensity value which differs from the substantially same intensity value.

13. A method as recited in claim 12, wherein the other intensity value corresponds to the electrical defect.

14. A method as recited in claim 12, wherein the electrical defect is a complete or partial electrical open defect within the structure.

15. A method as recited in claim 9, wherein the optically visible conductive upper portions are designed to form part of a same via chain which is designed to be coupled to the substrate.

16. A method as recited in claim 15, wherein the upper portions have a line width of less than or equal to 0.36 $\mu$m and a line spacing of less than or equal to 0.36 $\mu$m.

17. A method as recited in claim 16, wherein the conductive portions are formed from a damascene process.

18. A method as recited in claim 16, wherein the first and second substructure each includes a plurality of optically visible upper conductive portions.

19. A method as recited in claim 18, wherein the optically visible conductive portions of the first substructure is designed to form part of a same via chain which is designed to be coupled the substrate.

20. A method as recited in claim 19, wherein the first and second substructures each have a line width of less than or equal to 0.36 $\mu$m and a line spacing of less than or equal to 0.36 $\mu$m.

21. A method as recited in claim 20, wherein the conductive portions are formed from a damascene process.

22. An optical inspection system for optically inspecting a semiconductor voltage contrast type structure, the system comprising:
   a beam generator for directing an incident optical beam towards a sample surface;
   a detector positioned to detect a detected optical beam originating from the sample surface in response to the incident optical beam; and
   a processor arranged to:
      provide a semiconductor voltage contrast type structure that is designed to have an expected pattern of voltage potentials that would result in an expected pattern of bright and dark areas during a voltage contrast inspection;
      during an optical inspection, obtain an optical image of the voltage contrast type structure, wherein the optical image has a pattern of specific dark and bright areas;
      when the pattern of dark and bright areas of the optical image fail to substantially correspond to the expected pattern of dark and bright areas which are expected to occur during a voltage contrast inspection, determine that the structure has an electrical defect; and
      when the pattern of bright and dark areas of the optical image substantially correspond to the expected pattern of dark and bright areas which are expected to occur during a voltage contrast inspection, determine that the structure does not have an electrical defect.

23. A system as recited in claim 22, wherein the expected pattern of dark and bright areas are comprised of either all dark areas or all bright areas on the test structure.

24. A system as recited in claim 23, wherein the pattern of dark and bright areas of the optical image correspond to the expected pattern of dark and bright areas of the structure when the pattern of dark and bright areas of the optical image have a substantially same intensity value.

25. A system as recited in claim 24, wherein the expected pattern of dark and bright areas correspond to a portion of the structure that is coupled with a substrate.

26. A system as recited in claim 25, wherein the pattern of dark and bright areas of the optical image correspond to the expected pattern of dark and bright areas of the structure when the pattern of intensity values have a same relatively bright intensity value.

27. A system as recited in claim 25, wherein the structure includes a plurality of optically visible upper conductive portions.

28. A system as recited in claim 25, wherein the optically visible conductive upper portions are designed to form part of a same via chain which is designed to be coupled to the substrate.

29. A system as recited in claim 25, wherein the pattern of dark and bright areas of the optical image does not correspond to the expected pattern of dark and bright areas of the structure when the pattern of dark and bright areas include another intensity value which differs from the substantially same intensity value.

30. A system as recited in claim 29, wherein the other intensity value corresponds to the electrical defect.

31. A system as recited in claim 29, wherein the electrical defect is a complete or partial electrical open defect within the structure.

32. A system as recited in claim 23, wherein the expected pattern of dark and bright areas include a first dark area and a second bright area, the first dark area being adjacent to the second bright area.

33. A system as recited in claim 32, wherein either the first dark area or the second bright area corresponds to a first substructure of the structure that is coupled with a substrate and the other of either the first dark area or the second bright area corresponds with a second substructure of the structure that is not coupled with the substrate, wherein the first substructure is adjacent to the second substructure.

34. A system as recited in claim 33, wherein the pattern of dark and bright areas of the optical image correspond to the expected pattern of dark and bright areas of the structure when the first substructure corresponds to the first dark area and the second substructure corresponds to the second bright area or the first substructure corresponds to the second bright area and the second substructure corresponds to the first dark area.

35. A system as recited in claim 34, wherein the pattern of dark and bright areas of the optical image does not correspond to the expected pattern of dark and bright areas of the structure when the first substructure has a substantially same intensity value as the second substructure.

36. A system as recited in claim 35, wherein the same intensity value corresponds to an electrical short between the first and second substructures.

37. A system as recited in claim 32, wherein the first and second substructure each includes a plurality of optically visible upper conductive portions.

38. A system as recited in claim 37, wherein the optically visible conductive portions of the first substructure is designed to form part of a same via chain which is designed to be coupled the substrate.

* * * * *

UNITED STATES PATENT AND TRADEMARK OFFICE
CERTIFICATE OF CORRECTION

PATENT NO.     : 6,774,648 B1
DATED          : August 10, 2004
INVENTOR(S)    : Lin et al.

It is certified that error appears in the above-identified patent and that said Letters Patent is hereby corrected as shown below:

Column 8,
Line 62, change "suicides of Ti" to -- silicides of Ti --.

Column 9,
Line 66, change "arc selected" to -- are seleted --.

Column 12,
Line 46, change "contrast the structure" to -- contrast type structure --.

Signed and Sealed this

Twenty-first Day of December, 2004

JON W. DUDAS
*Director of the United States Patent and Trademark Office*